United States Patent
Kim et al.

(10) Patent No.: US 6,614,176 B2
(45) Date of Patent: Sep. 2, 2003

(54) ORGANIC ELECTROLUMINESCENT DEVICE INCLUDING CHARGE TRANSPORT BUFFER LAYER

(75) Inventors: Dong-hyun Kim, Suwon (KR); Sung-woo Cho, Seongnam (KR)

(73) Assignee: Samsung SDI Co., Ltd., Suwon (KR)

( * ) Notice: Subject to any disclaimer, the term of this patent is extended or adjusted under 35 U.S.C. 154(b) by 68 days.

(21) Appl. No.: 09/812,936

(22) Filed: Mar. 27, 2001

(65) Prior Publication Data

US 2002/0027416 A1 Mar. 7, 2002

(30) Foreign Application Priority Data

Mar. 27, 2000 (KR) .......................................... 2000-15572

(51) Int. Cl.[7] .................................................. H01J 1/62
(52) U.S. Cl. ........................ 313/506; 313/504; 428/917
(58) Field of Search ................................. 313/506, 503, 313/504; 315/169.3; 428/690, 917

(56) References Cited

U.S. PATENT DOCUMENTS

| | | | |
|---|---|---|---|
| 5,283,132 A | 2/1994 | Ogura et al. | |
| 6,252,246 B1 * | 6/2001 | Arai et al. | 313/504 |
| 6,396,209 B1 * | 5/2002 | Kido et al. | 313/504 |
| 6,423,429 B2 * | 7/2002 | Kido et al. | 313/506 |

* cited by examiner

*Primary Examiner*—Ashok Patel
(74) *Attorney, Agent, or Firm*—Staas & Halsey LLP

(57) ABSTRACT

An organic electroluminescent device includes a substrate, and an anode, a hole transport layer, a plurality of light emitting layers, an electron transport layer and a cathode in sequence laminated on the substrate, and a charge transport buffer layer. The charge transport buffer layer adjusts the proportion of excitons generated by two light emitting layers by adjusting a film thickness, and is formed between the light emitting layers. In the organic electroluminescent device, excitons are formed directly on a separate emission region, rather than at the interface between the hole transport layer and the light emitting layers, by forming the charge transport buffer layer between light emitting layers. As a result, lowering of the luminous efficiency is prevented at the interface due to formation of an exciplex. Further, the luminescence ratio of a dichromatic luminous region is adjusted by adjusting the thickness of the charge transport buffer layer, thus easily attaining color tuning.

15 Claims, 11 Drawing Sheets

ORGANIC ELECTROLUMINESCENT DEVICE INCLUDING CHARGE TRANSPORT BUFFER LAYER

CROSS-REFERENCE TO RELATED APPLICATIONS

This applications claims the benefit of Korean Application No. 00-15572, filed Mar. 27, 2000, in the Korean Industrial Property Office, the disclosure of which is incorporated herein by reference.

BACKGROUND OF THE INVENTION

1. Field of the Invention

The present invention relates to an organic electroluminescent device, and more particularly, to an organic electroluminescent device capable of exhibiting dichromatic luminescence while improving luminous efficiency by forming a charge transport buffer layer between light emitting layers.

2. Description of the Related Art

An organic electroluminescent device using an organic compound as the material for forming a light emitting layer provides excellent luminance, driving voltage, and response speed characteristics compared to an inorganic electroluminescent device using an inorganic compound as the material for forming a light emitting layer. Moreover, the organic electroluminescent device described above provides multi-color display.

FIG. 1 shows the basic construction of an organic electroluminescent device 10 described above.

Referring now to FIG. 1, an anode 12 is formed on a substrate 11. A hole transport layer 13, a light emitting layer 14, an electron transport layer 15, and a cathode 16 are sequentially laminated on the anode 12.

The driving principle of the afore-constructed organic electroluminescent device 10 will now be described.

If a voltage is applied between the anode 12 and the cathode 16, holes injected from the anode 12 move to the light emitting layer 14 via the hole transport layer 13. Electrons from the cathode 16 are injected into the light emitting layer 14 via the electron transport layer 15, and carriers (that is, the electrons and the holes) are recombined at the interface between the hole transport layer 13 and the light emitting layer 14 (the electron transport layer 15 itself may function as a light emitting layer) to generate excitons. These exciton are turned from an excitation state into a ground state, thus releasing energy and emitting light. Accordingly, fluorescent molecules of the light emitting layer 14 radiate light to form an image.

The organic electroluminescent device operating based on the above-described driving principle improves the luminous efficiency by enhancing charge balance. However, a carrier recombining region is formed at the interface between a hole transport layer and a light emitting layer (or electron transport layer) to form an exciplex, thereby lowering the luminous efficiency. Also, it is difficult to apply the organic electroluminescent device to exhibit dichromatic luminescence such as white luminescence.

To solve the above-described problem, U.S. Pat. No. 5,283,132 discloses an organic electroluminescent device exhibiting white luminescence. In the organic electroluminescent device disclosed in U.S. Pat. No. 5,283,132, a hole transport layer is formed from bis-di(p-tolyl)aminophenyl-1,1-cyclohexane, a luminescent layer is formed from a material having a luminescent peak at 460–480 nm, and the thickness of the luminescent layer is adjusted to be in the range of 100–300 Å, thereby obtaining an organic electroluminescent device capable of exhibiting white luminescence.

However, in practice in the organic electroluminescent device described above, it is difficult to adjust white balance properly due to a change in the blue color coordinate characteristic.

SUMMARY OF THE INVENTION

To solve the above problems, it is an object of the present invention to provide an organic electroluminescent device which prevents lowering of luminous efficiency due to formation of an exciplex by forming a charge transport buffer layer to cause excitons to be produced directly on a separate light emitting region rather than the interface between a hole transport layer and a light emitting layer and which achieves materialization of dichromatic luminescence by adjusting the thickness of the charge transport buffer layer.

Additional objects and advantages of the invention will be set forth in part in the description which follows, and, in part, will be obvious from the description, or may be learned by practice of the invention.

Accordingly, to achieve the above object, the present invention comprises an organic electroluminescent device comprising a substrate, and an anode, a hole transport layer, a plurality of light emitting layers, an electron transport layer and a cathode in laminated sequentially on the substrate. In the organic electroluminescent device of the present invention, a charge transport buffer layer adjusting the proportion generating excitons of two light emitting layers by adjusting a film thickness is formed between the light emitting layers.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Figure 1:
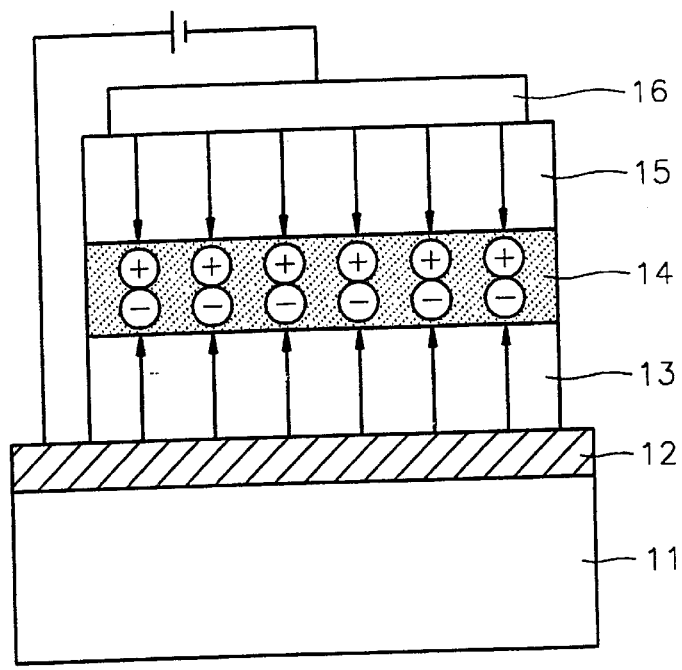
FIG. 1 is a schematic diagram illustrating the structure of a general organic electroluminescent device.

Reference will now be made in detail to the presented preferred embodiments of the present invention, examples of which are illustrated in the accompanying drawings, wherein like reference numerals refer to like elements throughout.

The organic electroluminescent device according to the present invention comprises a charge transport buffer layer formed between a plurality of light emitting layers so that the proportion of excitons generated in the light emitting layers is adjusted by adjusting a film thickness. In the present invention, the thickness of the charge transport buffer layer is 10 to 300 Å. Also, the charge transport buffer layer of the present invention includes host forming materials of light emitting layers adjacent to the charge transport buffer layer, which eliminate an interface effect between the light emitting layers and the charge transport buffer layer.

In the organic electroluminescent device according to the present invention, at least one of a hole transport layer, light emitting layers and an electron transport layer includes a dopant which emits light for hole-electron bonds. The dopants are exemplified by the following compounds.

1) 4-(dicyanomethylene)-2-tert-butyl-6-(1,1,7,7-tetramethyljulolidyl-9-enyl)-4H-pyran (DCJTB)

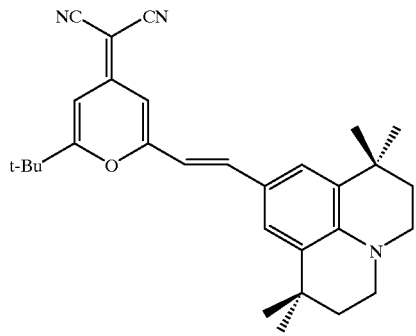

2) Rubrene

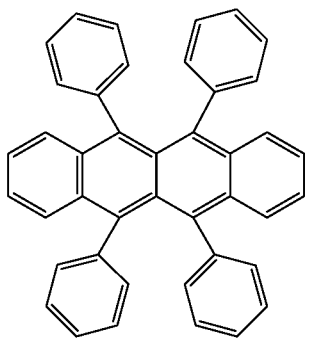

3) DCM

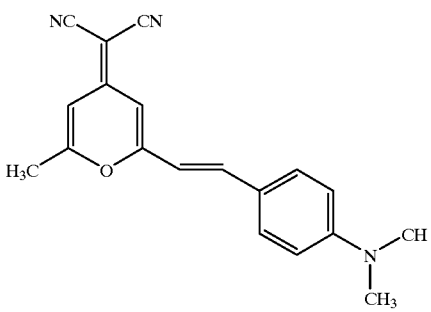

4) DCM2

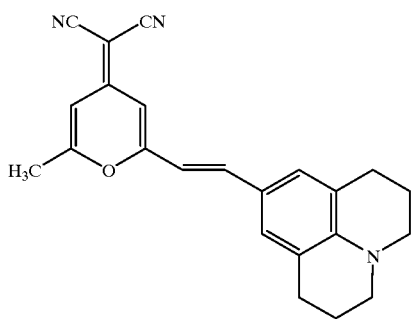

5) Perylene

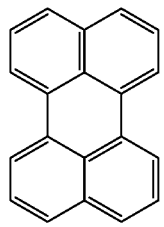

6) Quinacridone

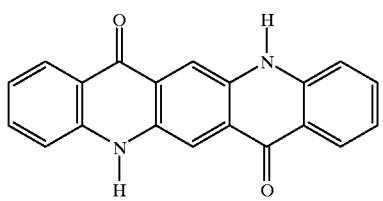

7) Coumarin 6

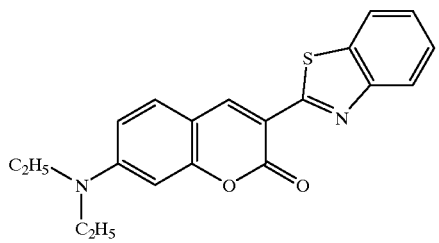

The content of the dopant is 0.1 to 5 wt % with respect to the weight of the host forming material of the hole transport layer, the light emitting layers and the electron transport layer. If the content of the dopant is less than 0.1 wt %, the doping effect is not exerted and the deposition rate is too low, causing a difficulty in doping a small amount of dopant. If the content of the dopant is greater than 5 wt %, interaction between dopants may occur, lowering the device efficiency. Also, a shift toward longer wavelengths during emission may occur, causing a difficulty in color tuning.

In addition, in the organic electroluminescent device according to the present invention, a hole injection layer is formed between the anode and the hole transport layer, or an electron injection layer is formed between the cathode and the electron transport layer.

In the present invention, excitons are formed directly on an emission region by moving charges using a tunnel effect by the charge transport buffer layer between light emitting layers. As a result, loss due to an interface energy barrier is reduced, and device stability is enhanced. Also, lowering of the luminous efficiency at the interface due to formation of an exciplex is prevented. Further, the luminescence ratio of a dichromatic luminous region is adjusted by adjusting the thickness of the charge transport buffer layer, thereby easily attaining color tuning.

Figure 2:
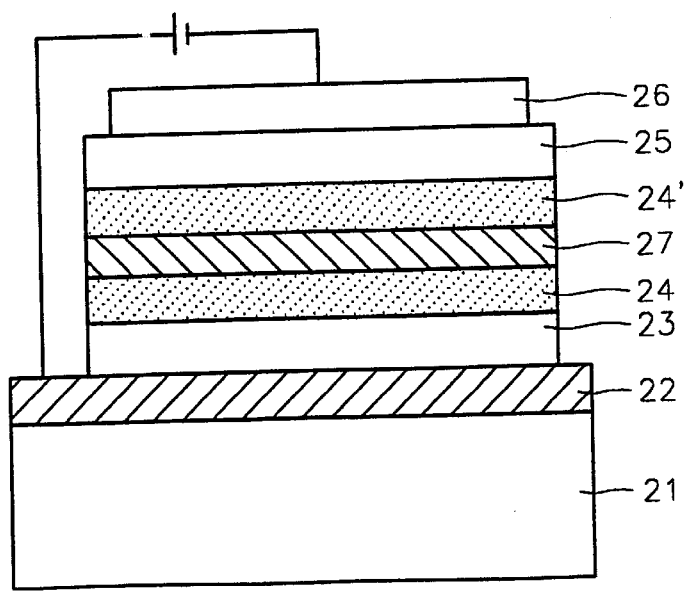
FIG. 2 is a schematic diagram illustrating the structure of an organic electroluminescent device according to an embodiment of the present invention.

FIG. 2 shows a structure of an organic electroluminescent device 20 according to a preferred embodiment of the present invention.

Referring to FIG. 2, the organic electroluminescent device 20 is constructed such that an anode 22 and a hole transport layer 23 are sequentially laminated on a substrate, and a first light emitting layer 24 and a second light emitting layer 24', an electron transport layer 25 and a cathode 26 are sequentially laminated on the hole transport layer 23. In the organic electroluminescent device 20 shown in FIG. 2, a charge transport buffer layer 27 adjusting the proportion of excitons produced in the first and second light emitting layers 24 and 24' and eliminating an interface effect is interposed between the first and second light emitting layers 24 and 24'. The charge transport buffer layer 27 adjusts the amount of accumulation of electrons or holes at the interface between light emitting layers 24, 24' due to an energy barrier and tunneling and migration of the electrons or holes to the light emitting layers 24 and 24', by adjusting the film thickness thereof. Also, the charge transport buffer layer 27 is formed by host forming materials for the hole transport layer 23 and/or the light emitting layers 24 and 24', used alone or in combination as a mixture, for the purpose of increasing the luminous efficiency of the device 20 by eliminating interface effects between the charge transport buffer layer 27 and the light emitting layers 24 and 24' and between the charge transport buffer layer 27 and the hole transport layer 23.

The charge transport buffer layer 27 comprises one or more of a plurality of layers as the case requires. That is, the charge transport buffer layer 27 comprises a first transport buffer layer made of a first emitting layer host material on a plane adjacent with the first light emitting layer 24, and a second transport buffer layer made of a second emitting layer host material on the first charge transport buffer layer on a plane adjacent with the second light emitting layer 24'. Here, the overall thickness of the charge transport buffer layer 27 is is 30 to 100 Å and ranges from 10 to 300 Å. If the overall thickness of the charge transport buffer layer 27 is out of this range, a main luminous region is formed on only one side, so that the effect of adjusting the proportion of forming excitons at two light emitting layers is undesirably removed.

Figure 3:
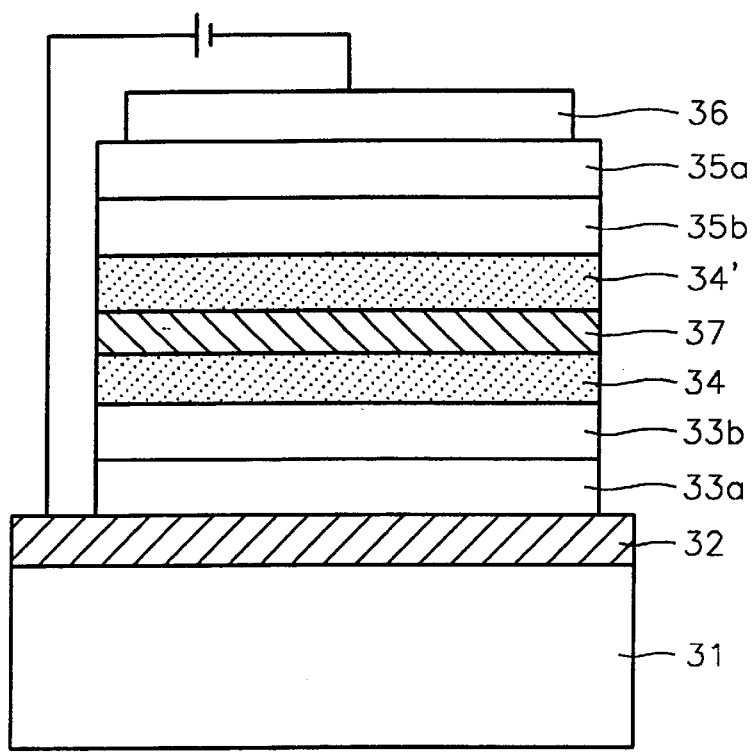
FIG. 3 is a schematic diagram illustrating the structure of an organic electroluminescent device according to another embodiment of the present invention.

FIG. 3 is a schematic diagram illustrating the structure of an organic electroluminescent device 30 according to another embodiment of the present invention.

Referring to FIG. 3, in the organic electroluminescent device 30 of the present invention, a hole injection layer 33a may be further formed between the hole transport layer 33b and the anode 32. Formation of the hole injection layer 33a reduces contact resistance between the anode 32 and the hole transport layer 33b and improves the hole transporting capacity of the anode 32 with respect to the light emitting layers 34, 34', thereby improving the overall device characteristics. The organic electroluminescent device 30 of the present invention of FIG. 3 also includes charge transport buffer layer 37 positioned as shown in FIG. 3.

As a material for forming the hole injection layer, 4,4'4"-tris(N-3-methylphenyl-N-phenyl-amino)-triphenylamine (m-MTDATA) having the following formula is used.

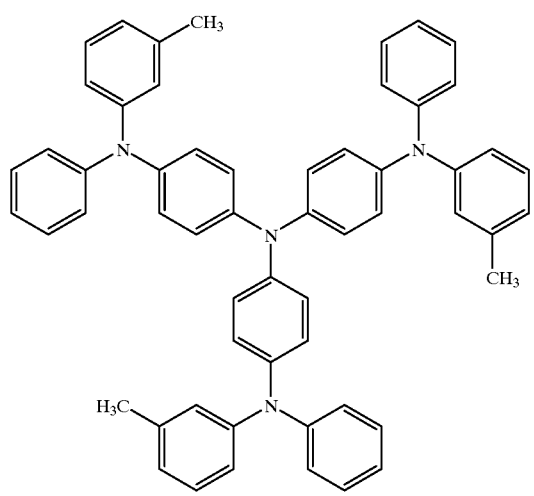

Also, phthalociane copper (CuPc) having the following formula may be used as the material for forming the hole injection layer 33a.

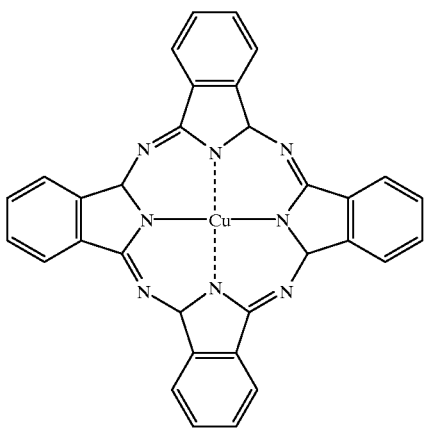

The thickness of the hole injection layer 33a is 100 to 2000 Å. If the thickness of the hole injection layer 33a is smaller than 100 Å, the amount of injection holes becomes too small to maintain a charge balance. If the thickness of the hole injection layer 33a is greater than 2000 Å, the driving voltage excessively increases, which is undesirable.

Referring again to FIG. 3, in the organic electroluminescent device 30 of the present invention, an electron injection layer 35a may be further formed between the electron transport layer 35b and the cathode 36. In the organic electroluminescent device 30, lithium fluoride (LiF) is used as the material for forming the electron injection layer 35a, and the thickness of the electron injection layer 35a is 5 to 20 Å. If the thickness of the electron injection layer 35a is smaller than 5 Å, deposition of a small amount of the electron injection layer 35a and uniform deposition are difficult to achieve. If the thickness of the electron injection layer 35a is greater than 20 Å, electricity does not undesirably flow due to LiF, which is an insulating material.

The organic electroluminescent device 30 may be manufactured in order of the anode 32, the hole transport layer 33b, the light emitting layers 34, 34', the electron transport layer 35b, and the cathode 36, or in the reverse order, that is, from the cathode 36, the electron transport layer 35b, the light emitting layers 34, 34', the hole transport layer 33b and the anode 32. In the latter case, the substrate 31 is not necessarily formed of a transparent material, and the aperture ratio increases.

In the organic electroluminescent device 30 of the present invention, either a substrate which is used for general organic electroluminescent devices is used as the substrate 31, or a glass substrate or a transparent plastic substrate having excellent transparency, surface smoothness, flexibility and water proofing property is used as the substrate 31. Also, either tin-doped indium oxide (ITO), stannic oxide ($SnO_2$) or zinc oxide (ZnO) having excellent transparency and conductivity is used as the material for an anode electrode 32, and the film thickness thereof is in the range of 500 to 2000 Å. Usable metals for forming a cathode 36 include lithium (Li), magnesium (Mg), aluminum (Al), aluminum-lithium (Al—Li), calcium (Ca), magnesium-indium (Mg—In), or magnesium-silver (Mg—Ag), and the film thickness thereof is in the range of 500 to 5000 Å. For device stability and efficiency, lithium fluoride (LiF), having a high reactivity and a low work function, is formed as the cathode 36 to a thickness of 5 to 20 Å, and aluminum having a high work function is then formed thereon to a thickness of 1000 to 2000 Å.

Also, usable materials for forming the hole transport layer 33b include N,N'-Di(naphthalene-1-yl)-N,N'-diphenyl-benzidine (NPB). The thickness of the hole transport layer 33b is in the range of 100 to 2000 Å for device stability and efficiency.

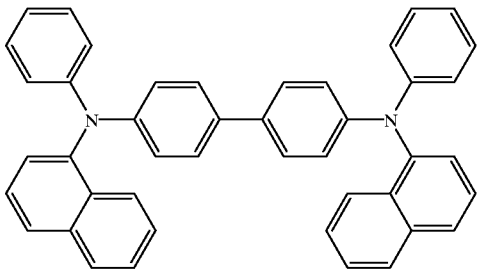

A dopant which can emit light to an electron-hole bond may be further added to the hole transport layer 33b in addition to the hole transporting material. Usable dopants include 4-(dicyanomethylene)-2-t-butyl-6-(1,1,7,7-tetramethyljulolidyl-9-enyl)-4H-ryran (DCJTB) represented by the above formula, Coumarin 6, Rubrene, DCM, DCM2, perylene, Quinacridone or the like, and the content thereof is in the range of 0.1 to 5 wt % based on the weight of the hole transporting material. As described above, if the dopant is added when the hole transport layer 33b is formed, the luminous color can be adjusted according to the kind and content of dopant added, and the thermal stability of the hole transport layer 33b can be improved, thereby increasing the lifetime of the device.

As an electron transporting material for forming an electron transport layer 35b, tris(8-quinolinolate)-aluminum (hereinafter abbreviated to "$Alq_3$") represented by the following formula or $Almq_3$ represented by the following formula, can be used. Like the above-described hole transport layer 33b, the electron transport layer 35b may further include a dopant which can emit light to an electron-hole bond. Here, the kind and content of the dopant used is substantially the same as that of the hole transport layer 33b. The film thickness of the electron transport layer 35b is in the range of 100 to 2000 Å, which is desirable for device stability and efficiency.

1)$Alq_3$

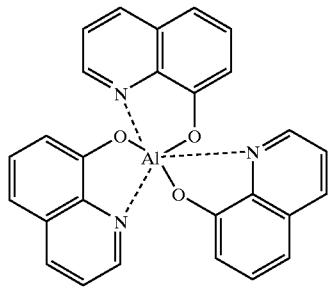

2)Almq3

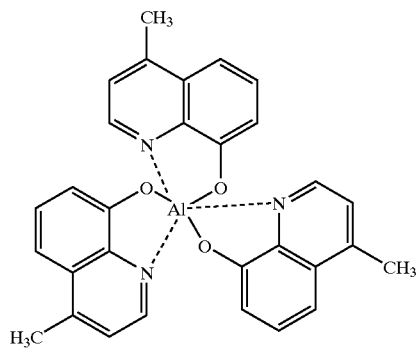

The blue light emitting layer 34' of the present invention is in the range of 50 to 500 Å in thickness, and materials for forming the blue light emitting layer 34' are not specifically restricted to, but are exemplified by, 4,4"-bis(2,2-diphenylvinyl-1-yl)-p-terphenylene (DPVTP) having the following formula, DPVBi, Spiro-DPVBi and the like.

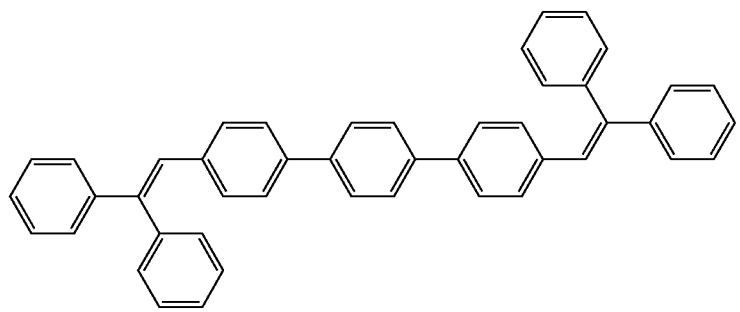

DPVTP
4,4"-bis(2,2-diphenylvinyl-1-y1)-p-terphenylene

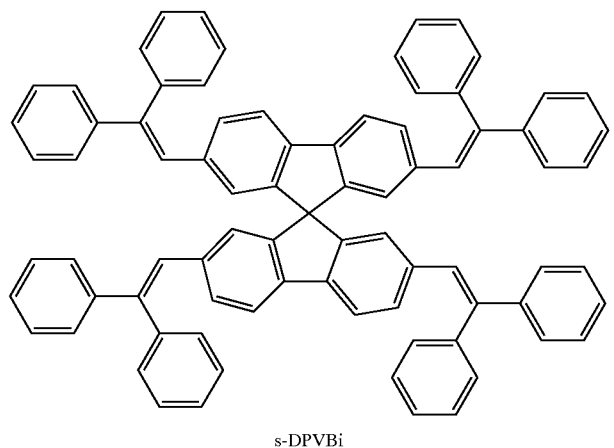

s-DPVBi

Like the above-described hole transport layer 33b and electron transport layer 35b, the light emitting layer 34' may also further include a dopant capable of emitting light for electron-hole bonds as well as materials for forming host such as DPVTP. The kind and content of dopant are substantially the same as those of the hole transport layer 33b and electron transport layer 35b, described hereinabove.

The present invention is described in further detail with reference to the following Examples. However, it should be understood that the present invention is not restricted to such specific Examples.

EXAMPLE 1

An ITO electrode was formed on a glass substrate to a thickness of 1800 Å and then m-MTDATA was vacuum-deposited thereon to form a hole injection layer to a thickness of 600 Å. Then, NPB was vacuum-deposited on the hole injection layer to form a hole transport layer having a thickness of 100 Å.

Thereafter, NPB and DCJTB were simultaneously vacuum-deposited on the hole transport layer to form a first light emitting layer having a thickness of 100 Å. Here, the content of NPB was 99.5 wt % and the content of DCJTB was 0.5 wt %.

Subsequently, NPB was vacuum-deposited on the first light emitting layer to form a charge transport buffer layer having a thickness of 30 Å and then DPVTP was vacuum-deposited on the charge transport buffer layer to form a second light emitting layer having a thickness of 100 Å. Next, $Alq_3$ was vacuum-deposited on the second light emitting layer to form an electron transport layer having a thickness of 500 Å.

Then, LiF was vacuum-deposited on the electron transport layer to form an LiF electron injection layer having a thickness of 10 Å, Al was then vacuum-deposited on the LiF electron injection layer to form an Al electrode to a thickness of 1000 Å, thereby manufacturing an organic electroluminescent device represented by the following structure:

m-MTDATA(60 nm)/NPB(10 nm)/NPB+0.5% DCJTB(10 nm)/ NPB(3 nm)/DPVPT(10 nm)/Alq₃(50 nm)/LiF(1 nm)/Al.

EXAMPLES 2–4

Organic electroluminescent devices represented by the following structures were manufactured in the same manner as described in Example 1 except that the thickness of each charge transport buffer layer was changed into 40, 50 and 100 Å, respectively:

m-MTDATA(60 nm)/NPB(10 nm)/NPB+0.5% DCJTB(10 nm)/ NPB(4 nm)/DPVPT(10 nm)/Alq3(50 nm)/LiF(1 nm)/Al;

m-MTDATA(60 nm)/NPB(10 nm)/NPB+0.5% DCJTB(10 nm)/ NPB(5 nm)/DPVPT(10 nm)/Alq3(50 nm)/LiF(1 nm)/Al;

and m-MTDATA(60 nm)/NPB(10 nm)/NPB+0.5% DCJTB(10 nm)/ NPB(10 nm)/DPVPT(10 nm)/Alq3(50 nm)/LiF(1 nm)/Al.

In the organic electroluminescent devices manufactured in Examples 1–4, a charge transport buffer layer was formed between a first light emitting layer and a second light emitting layer so that some electrons were tunneled to contribute to yellow-orange luminescence in DCJTB of the first light emitting layer and the other electrons contributed to blue luminescence in DPVTP of the second light emitting layer. As described above, dichromatic luminescence of yellow-orange and blue are materialized. In particular, in the organic electroluminescent device manufactured in Example 1, since the yellow-orange and blue electroluminescence (EL) intensities were substantially similar, white luminescence is realized by combination of both color luminescences. Also, like in the organic electroluminescent device manufactured in Example 4 in which the thickness of the charge transport buffer layer was 100 Å, blue luminescence was stronger than yellow-orange luminescence.

COMPARATIVE EXAMPLE

An ITO electrode was formed on a glass substrate to a thickness of 1800 Å and then m-MTDATA was vacuum-deposited thereon to form a hole injection layer to a thickness of 600 Å. Subsequently, NPB was vacuum-deposited on the hole injection layer to form a hole transport layer having a thickness of 100 Å.

Thereafter, NPB and DCJTB were simultaneously vacuum-deposited on the hole transport layer to form a first light emitting layer having a thickness of 100 Å. Here, the content of NPB was 99.5 wt % and the content of DCJTB was 0.5 wt %.

Subsequently, DPVTP was vacuum-deposited on the first light emitting layer to form a second light emitting layer having a thickness of 100 Å. Then, Alq₃ was vacuum-deposited on the second light emitting layer to form an electron transport layer having a thickness of 500 Å.

Thereafter, LiF was vacuum-deposited on the electron transport layer to form an LiF electrode having a thickness of 10 Å, and Al was then vacuum-deposited on the LiF electrode to form an Al electrode to a thickness of 1000 Å, thereby manufacturing an organic electroluminescent device.

Figure 4A:
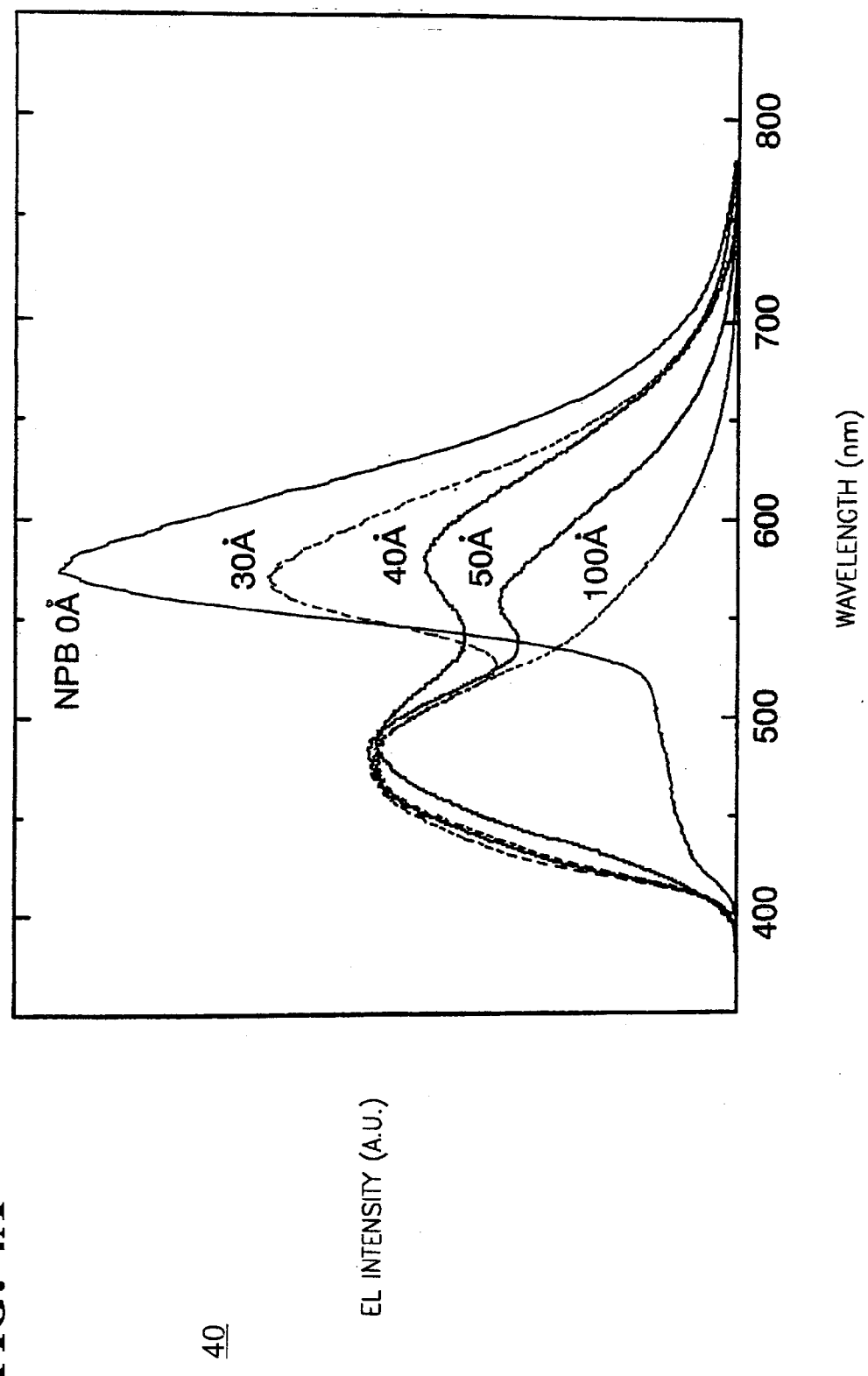
FIGS. 4A and 4B illustrate emission spectrum and CIE (Commission Internationale d'Eclairage) coordinates characteristics in organic electroluminescent devices manufactured by Examples 1 through 4 and a Comparative Example.
Figure 4B:
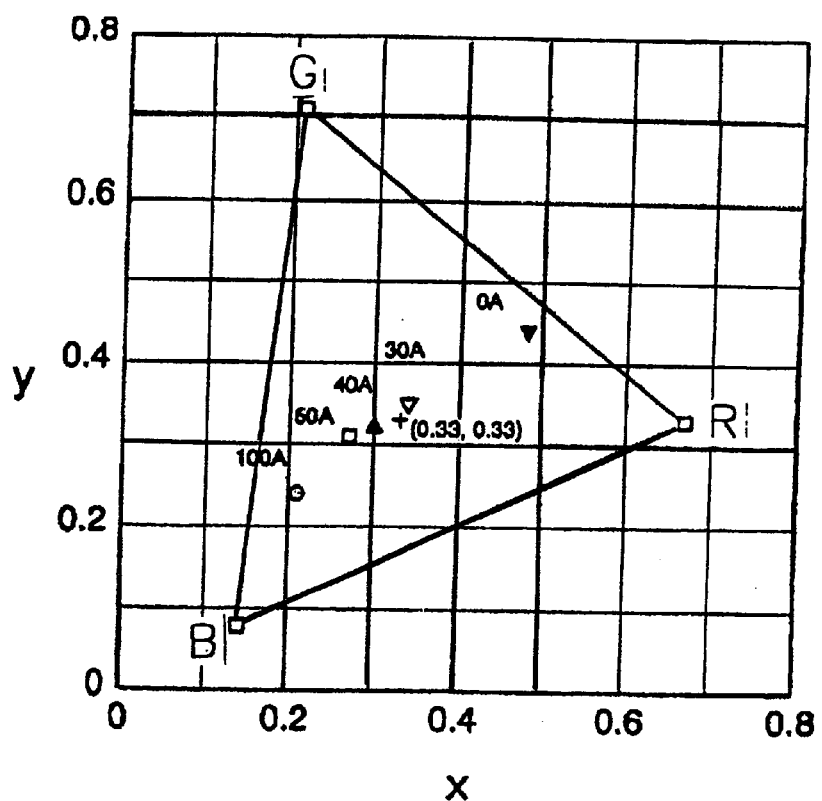

In the organic electroluminescent devices manufactured in Examples 1–4 and Comparative Example, the luminescence spectrum 40 and CIE coordinates (x, y) characteristics 42 were examined and the results are shown in FIGS. 4A and 4B.

Referring to FIGS. 4A and 4B, as the thickness of the charge transport buffer layer changes from 30 Å to 100 Å, the EL intensity of yellow-orange luminescence originated from the first light emitting layer decreased while the EL intensity of blue luminescence originated from the second emitting layer increased.

On the other hand, if the charge transport buffer layer is not formed like in the Comparative Example, only the yellow-orange region peaks from the first light emitting layer were observed and few blue region peaks from the second light emitting layer were exhibited.

Also, the CIE coordinates (x, y) characteristics 42 shown in FIG. 4B showed that white light was realized in the case where the thickness of the charge transport buffer layer was 30 Å and desired color display could be realized by adjusting the proportion of excitons generated in the luminous region by adjusting the thickness of the charge transport buffer layer.

Figure 5:
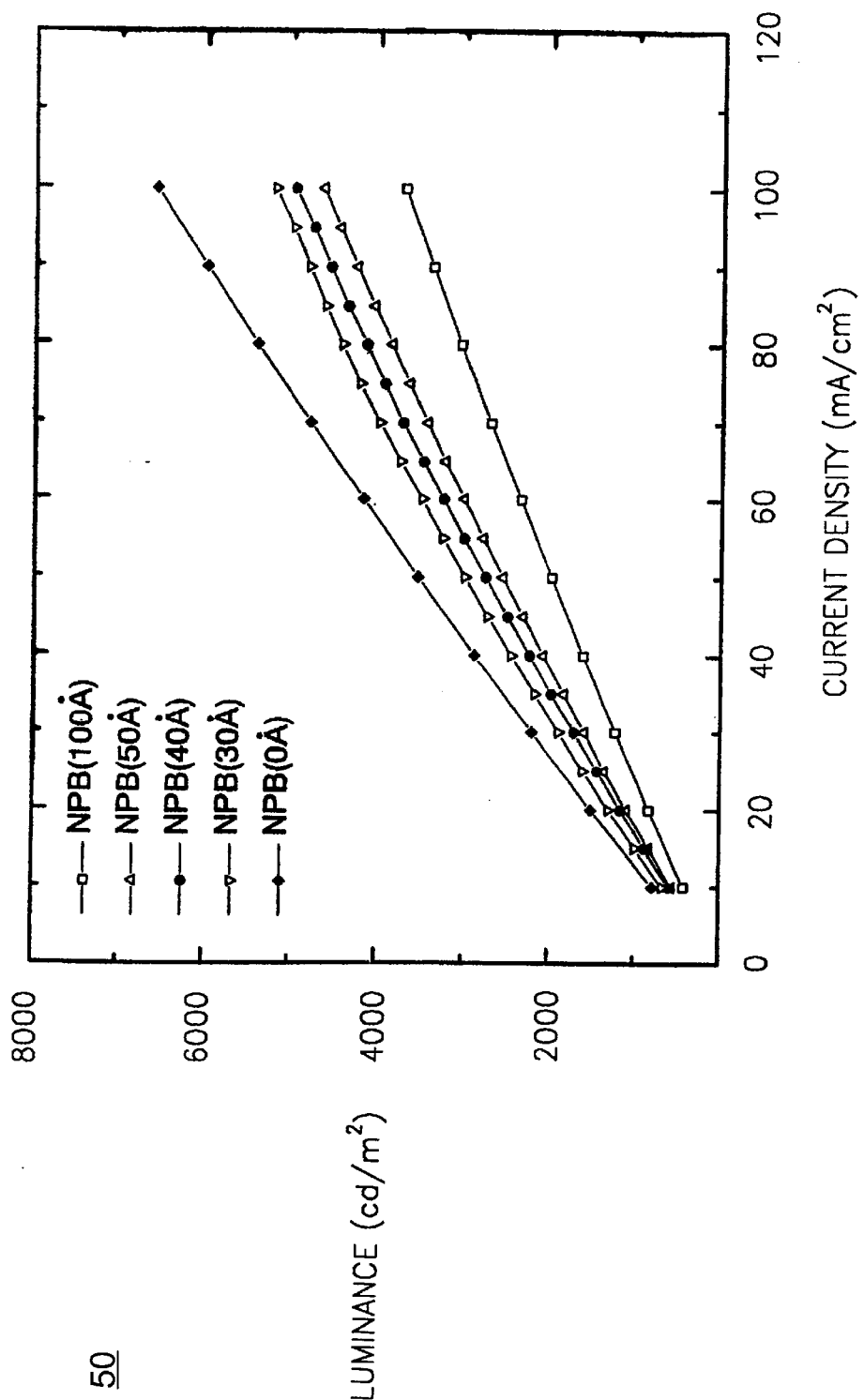
FIG. 5 is a graph showing a change in the luminance depending on current density in organic electroluminescent devices manufactured by Examples 1 through 4 and the Comparative Example.
Figure 6:
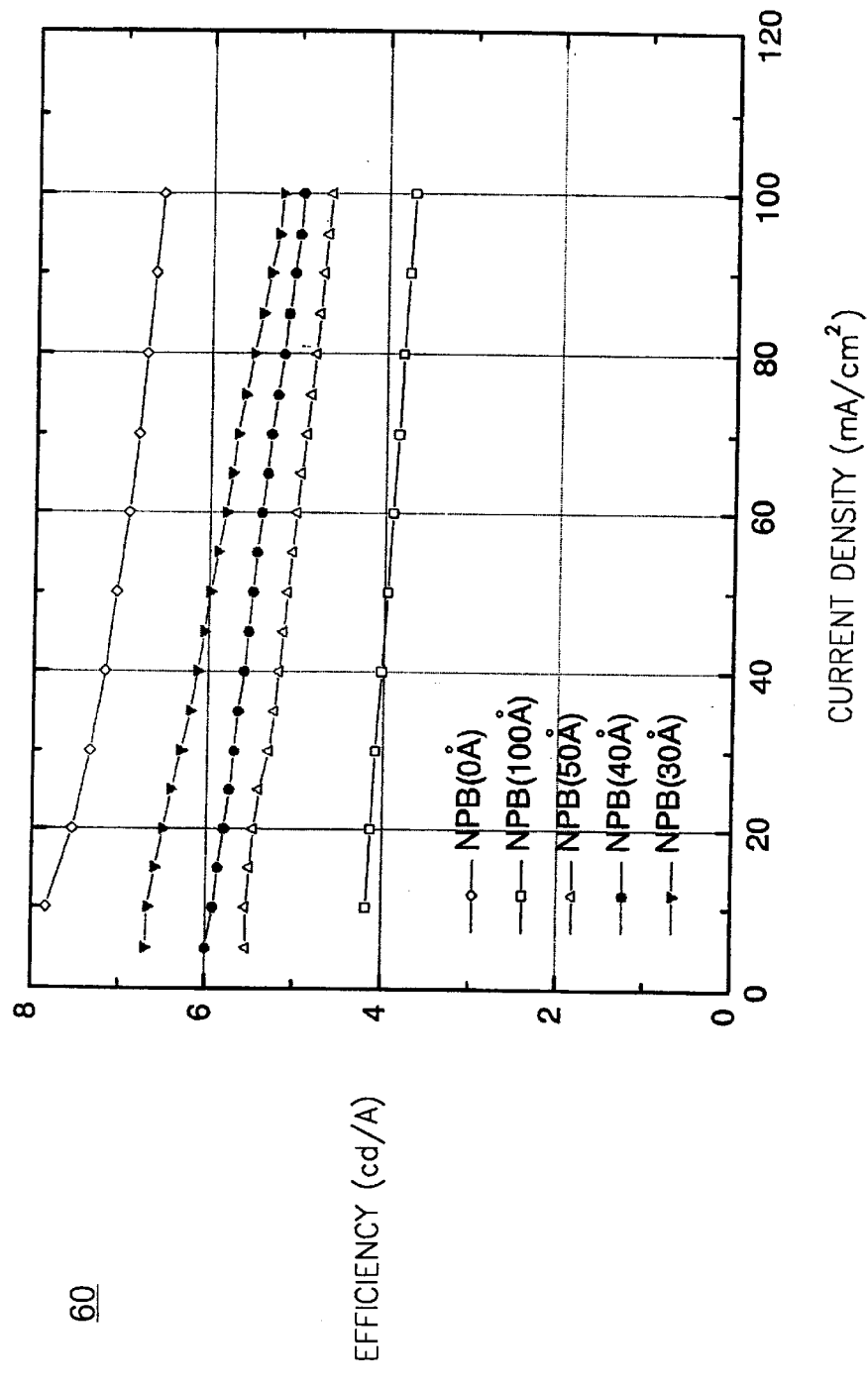
FIG. 6 is a graph showing a change in the luminous efficiency depending on current density in organic electroluminescent devices manufactured by Examples 1 through 4 and the Comparative Example.

FIGS. 5 and 6 are graphs 50, 60 showing a change in the luminance depending on current density in organic electroluminescent devices manufactured by Examples 1 through 4 and Comparative Example.

Referring to FIG. 5, the luminance linearly increases as the current density increases.

Referring to FIG. 6, when the charge transport buffer layer is not formed, like in the Comparative Example, yellow-orange luminescence is performed and the luminous efficiency of the device is 6–7 cd/A. If the thickness of the charge transport buffer layer is increased to 30, 40 and 50 Å, respectively, the luminous efficiency of the device gradually decreases. When the thickness of the charge transport buffer layer is 100 Å, blue luminescence is performed an the luminous efficiency is 3–4 cd/A.

In the organic electroluminescent devices manufactured in Examples 1–4 and Comparative Example, the luminance efficiency, the maximum luminance, the external quantum efficiency and the CIE coordinates characteristics were evaluated and the results thereof are shown in Table 1.

TABLE 1

| | Thickness of NPB layer (Å) | Luminance efficiency (cd/A) | Maximum luminance (cd/m²) | External Quantum efficiency (%) | CIE coordinates (x, y) |
|---|---|---|---|---|---|
| Example 1 | 30 | 6.7 (@10 mA/cm²) 5.2 (@100 mA/cm²) | 21,740 (at 13.8 V) | 2.94 | (0.34, 0.35) |
| Example 2 | 40 | 5.9 (@10 mA/cm²) 5.0 (@100 mA/cm²) | — | 2.67 | (0.30. 0.32) |
| Example 3 | 50 | 5.5 (@10 mA/cm²) 4.6 (@100 mA/cm²) | — | 2.70 | (0.27, 0.31) |
| Example 4 | 100 | 4.2 (@10 mA/cm²) 3.7 (@100 mA/cm²) | — | 2.39 | (0.21, 0.24) |
| Comparative Example | 0 | 7.8 (@10 mA/cm²) 6.6 (@100 mA/cm²) | — | 2.82 | (0.48, 0.44) |

It was understood from Table 1 that the organic electroluminescent devices manufactured in Examples 1–4 could achieve dichromatic luminescence and were excellent in view of luminance efficiency, maximum luminance, external quantum efficiency and CIE coordinates characteristics, compared to the organic electroluminescent device manufactured in the Comparative Example.

EXAMPLE 5

An ITO electrode was formed on a glass substrate to a thickness of 1800 Å (Sheet resistance: 10 Ω/□ or 10 ohms per square) and then m-MTDATA was vacuum-deposited thereon to form a hole injection layer to a thickness of 600 Å. Subsequently, NPB was vacuum-deposited on the hole injection layer to form a hole transport layer having a thickness of 100 Å.

Thereafter, NPB and DCJTB were simultaneously vacuum-deposited on the hole transport layer to form a first light emitting layer having a thickness of 100 Å. Here, the content of NPB was 99.5 wt % and the content of DCJTB was 0.5 wt %.

Subsequently, NPB was vacuum-deposited on the first light emitting layer to form a charge transport buffer layer having a thickness of 20 Å and then s-DPVBi was vacuum-deposited on the charge transport buffer layer to form a second light emitting layer having a thickness of 300 Å. Then, $Alq_3$ was vacuum-deposited on the second light emitting layer to form an electron transport layer having a thickness of 200 Å.

Thereafter, LiF was vacuum-deposited on the electron transport layer to form an LiF electron injection layer having a thickness of 10 Å, and Al was then vacuum-deposited on the LiF electron injection layer to form an Al electrode to a thickness of 1000 Å, thereby manufacturing an organic electroluminescent device represented by the following structure:

m-MTDATA(60 nm)/NPB(10 nm)/NPB+0.5% DCJTB(10 nm)/
NPB(2 nm)/s-DPVBi(30 nm)/Alq₃(20 nm)/LiF(1 nm)/Al.

EXAMPLES 6–7

Organic electroluminescent devices represented by the following structures were manufactured in the same manner as described in Example 5 except that the thickness of each charge transport buffer layer was changed into 30 and 40 Å, respectively:

m-MTDATA(60 nm)/NPB(10 nm)/NPB+0.5% DCJTB(10 nm)/
NPB(3 nm)/s-DPVBi(30 nm)/Alq₃(20 nm)/LiF(1 nm)/Al;

and m-MTDATA(60 nm)/NPB(10 nm)/NPB+0.5% DCJTB(10 nm)/
NPB(4 nm)/s-DPVBi(30 nm)/Alq₃(20 nm)/LiF(1 nm)/Al.

EXAMPLES 8–10

Organic electroluminescent devices represented by the following structures were manufactured in the same manner as described in Example 5 except that the thickness of an ITO electrode was 800 Å (sheet resistance: 30 Ω/□).

Figure 7:
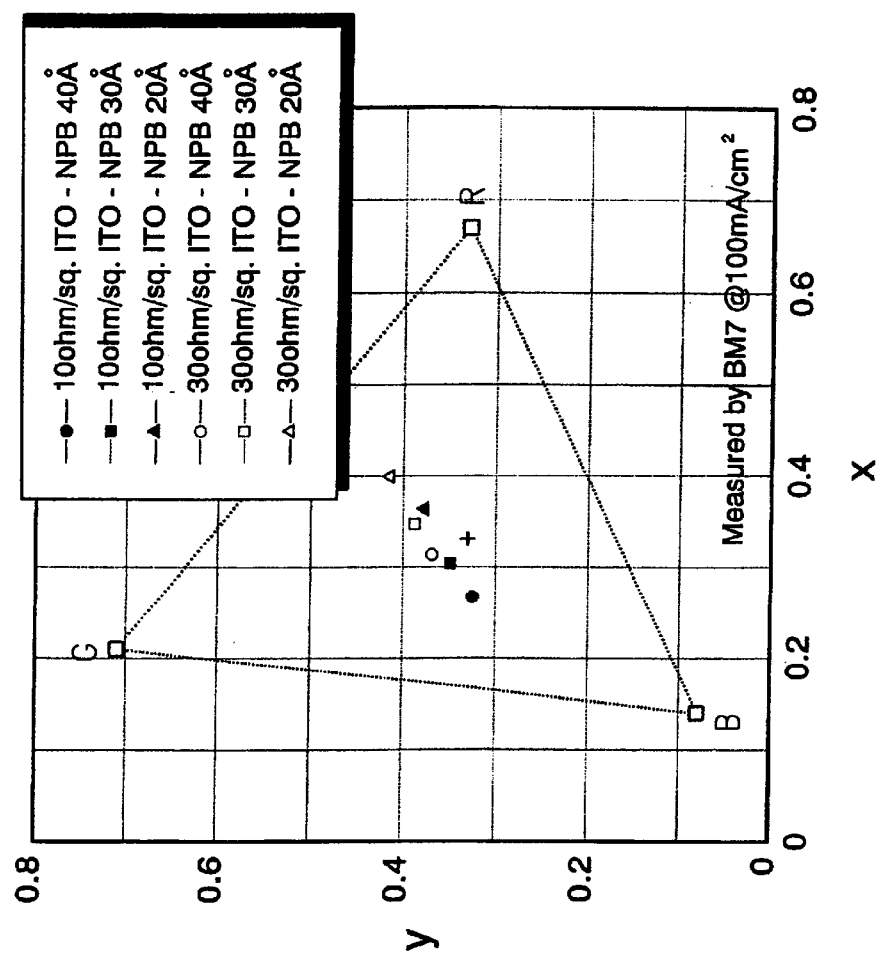
FIG. 7 illustrates CIE (Commission Internationale d'Eclairage) coordinates characteristics in organic electroluminescent devices manufactured by Examples 5 through 10.

In the organic electroluminescent devices manufactured in Examples 5–10, the CIE coordinates characteristics were examined and the result 70 is shown in FIG. 7.

Referring to FIG. 7, when s-DPVBi is used for the second light emitting layer, white luminescence could be realized. Also, it was ascertained that the probability of generating excitons in the luminous region was adjusted by adjusting the thickness of the charge transport buffer layer and the sheet resistance of the ITO electrode, thereby attaining color realization as desired.

Figure 8:
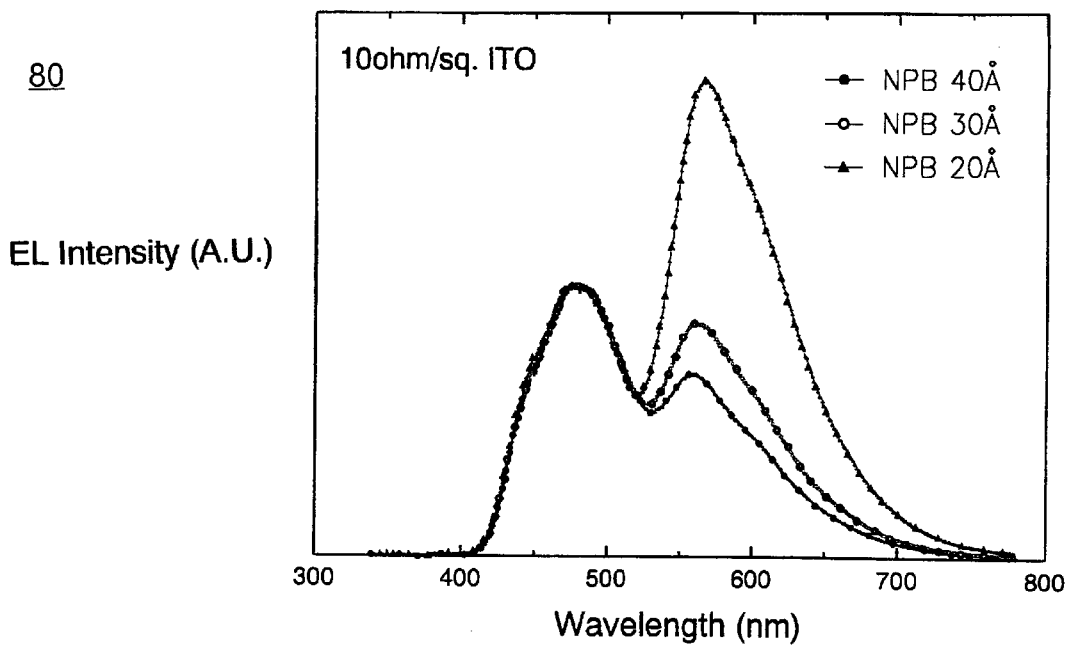
FIG. 8 illustrates emission spectrum in organic electroluminescent devices manufactured by Examples 5 through 7.
Figure 9:
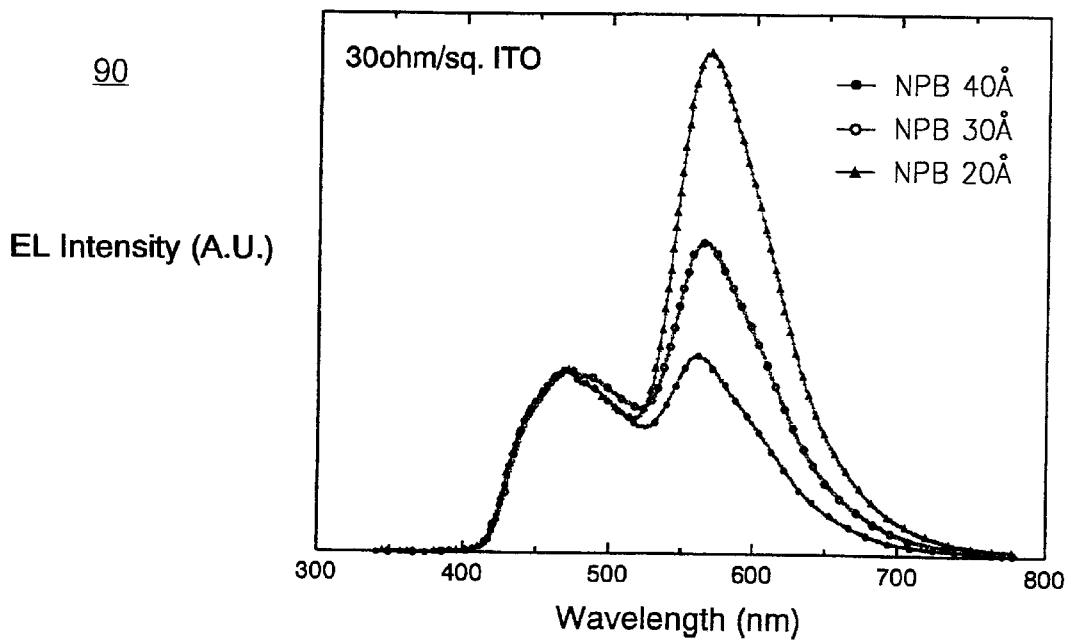
FIG. 9 illustrates emission spectrum in organic electroluminescent devices manufactured by Examples 8 through 10.

FIG. 8 illustrates emission spectrum 80 in organic electroluminescent devices manufactured by Examples 5 through 7, and FIG. 9 illustrates emission spectrum 90 in organic electroluminescent devices manufactured by Examples 8 through 10, respectively.

Referring to FIGS. 8 and 9, as the thickness of the charge transport buffer layer changes from 20 Å to 40 Å, the EL intensity of yellow-orange luminescence originated from the first light emitting layer decreased when the EL intensity of blue luminescence originated from the second emitting layer was normalized to the same intensity.

Figure 10:
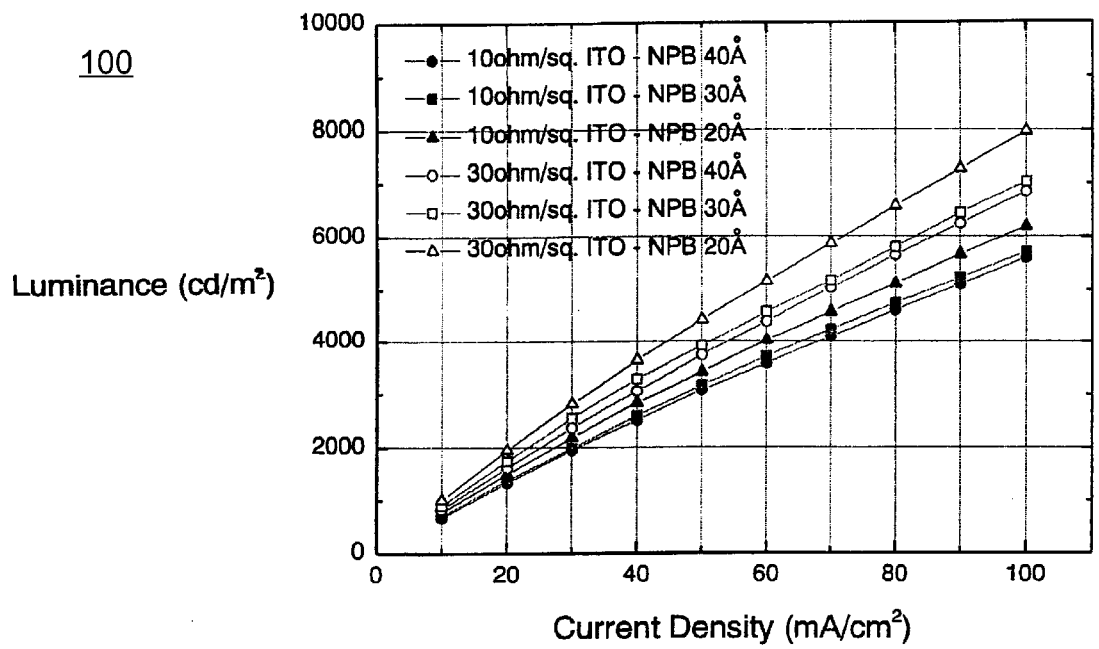
FIGS. 10 and 11 are graphs showing emission characteristics and changes in the luminous efficiency depending on current density in organic electroluminescent devices manufactured by Examples 5 through 10.
Figure 11:
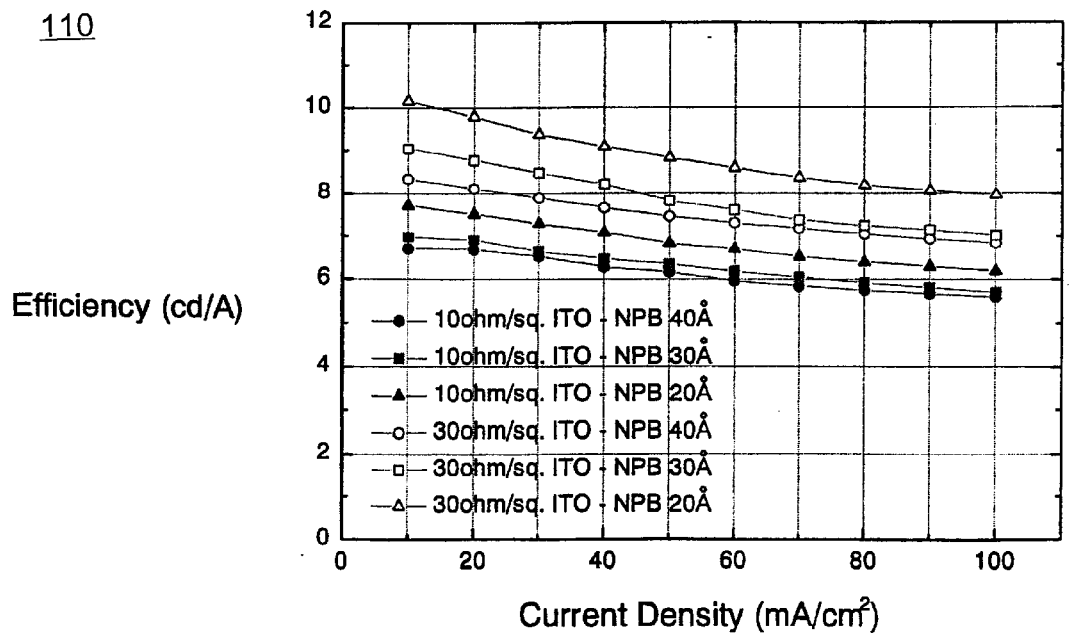

FIGS. 10 and 11 are graphs 100, 110 showing changes in the luminance and luminous efficiency depending on current density in organic electroluminescent devices manufactured by Examples 5 through 10, respectively.

Referring to FIG. 10, the luminance linearly increases as the current density increases.

Referring to FIG. 11, if the thickness of the charge transport buffer layer is increased to 20, 30 and 40 Å, respectively, the luminous efficiency of the device gradually decreases. Also, when the sheet resistance of the ITO electrode is 30 Ω/□, the luminous efficiency increases more than when the sheet resistance of the ITO electrode is 30 Ω/□.

In the organic electroluminescent devices manufactured in Examples 5–10, the luminance efficiency, the maximum luminance, the external quantum efficiency and the CIE coordinates characteristics were evaluated and the results thereof are shown in Table 2.

TABLE 2

| | ITO sheet resistance (Ω/□) | Thickness of NPB layer (Å) | Luminance efficiency (cd/A) | External Quantum efficiency (%) | CIE coordinates (x, y) |
|---|---|---|---|---|---|
| Example 5 | 10 | 20 | 7.7 (@10 mA/cm²) 6.2 (@100 mA/cm²) | 3.15 | (0.36, 0.38) |
| Example 6 | 10 | 30 | 7.0 (@10 mA/cm²) 5.7 (@100 mA/cm²) | 3.17 | (0.30, 0.35) |
| Example 7 | 10 | 40 | 6.7 (@10 mA/cm²) 5.6 (@100 mA/cm²) | 3.14 | (0.27, 0.32) |
| Example 8 | 30 | 20 | 10.2 (@10 mA/cm²) 8.0 (@100 mA/cm²) | 3.78 | (0.39, 0.41) |
| Example 9 | 30 | 30 | 9.1 (@10 mA/cm²) 7.0 (@100 mA/cm²) | 3.57 | (0.35, 0.39) |
| Example 10 | 30 | 40 | 8.4 (@10 mA/cm²) 6.8 (@100 mA/cm²) | 3.56 | (0.31, 0.37) |

EXAMPLE 11

An ITO electrode was formed on a glass substrate to a thickness of 1800 Å (Sheet resistance: 10 Ω/□) and then CuPc was vacuum-deposited thereon to form a hole injection layer to a thickness of 200 Å. Subsequently, NPB was vacuum-deposited on the hole injection layer to form a hole transport layer having a thickness of 400 Å.

Thereafter, NPB and DCJTB were simultaneously vacuum-deposited on the hole transport layer to form a first light emitting layer having a thickness of 100 Å. Here, the content of NPB was 99.5 wt % and the content of DCJTB was 0.5 wt %.

Subsequently, NPB was vacuum-deposited on the first light emitting layer to form a charge transport buffer layer having a thickness of 20 Å and then s-DPVBi was vacuum-deposited on the charge transport buffer layer to form a second light emitting layer having a thickness of 300 Å. Then, $Alq_3$ was vacuum-deposited on the second light emitting layer to form an electron transport layer having a thickness of 200 Å.

Thereafter, LiF was vacuum-deposited on the electron transport layer to form an LiF electron injection layer having a thickness of 10 Å, and Al was then vacuum-deposited on the LiF electron injection layer to form an Al electrode to a thickness of 1000 Å, thereby manufacturing an organic electroluminescent device represented by the following structure:

CuPc(20 nm)/NPB(40 nm)/NPB+0.5% DCJTB(10 nm)/NPB(2 nm)/s-DPVBi(30 nm)/$Alq_3$(20 nm)/LiF(1 nm)/Al.

EXAMPLE 12

An ITO electrode was formed on a glass substrate to a thickness of 1800 Å (Sheet resistance: 10 Ω/□) and then CuPc was vacuum-deposited thereon to form a hole injection layer to a thickness of 200 Å. Subsequently, NPB was vacuum-deposited on the hole injection layer to form a hole transport layer having a thickness of 400 Å.

Thereafter, NPB and Rubrene were simultaneously vacuum-deposited on the hole transport layer to form a first light emitting layer having a thickness of 100 Å. Here, the content of NPB was 98.5 wt % and the content of Rubrene was 1.5 wt %.

Subsequently, NPB was vacuum-deposited on the first light emitting layer to form a charge transport buffer layer having a thickness of 20 Å and then s-DPVBi was vacuum-deposited on the charge transport buffer layer to form a second light emitting layer having a thickness of 300 Å. Then, $Alq_3$ was vacuum-deposited on the second light emitting layer to form an electron transport layer having a thickness of 200 Å.

Thereafter, LiF was vacuum-deposited on the electron transport layer to form an LiF electron injection layer having a thickness of 10 Å, and Al was then vacuum-deposited on the LiF electron injection layer to form an Al electrode to a thickness of 1000 Å, thereby manufacturing an organic electroluminescent device represented by the following structure:

CuPc(20 nm)/NPB(40 nm)/NPB+1.5% Rubrene(10 nm)/NPB(2 nm)/s-DPVBi(30 nm)/$Alq_3$(20 nm)/LiF(1 nm)/Al.

Figure 12:
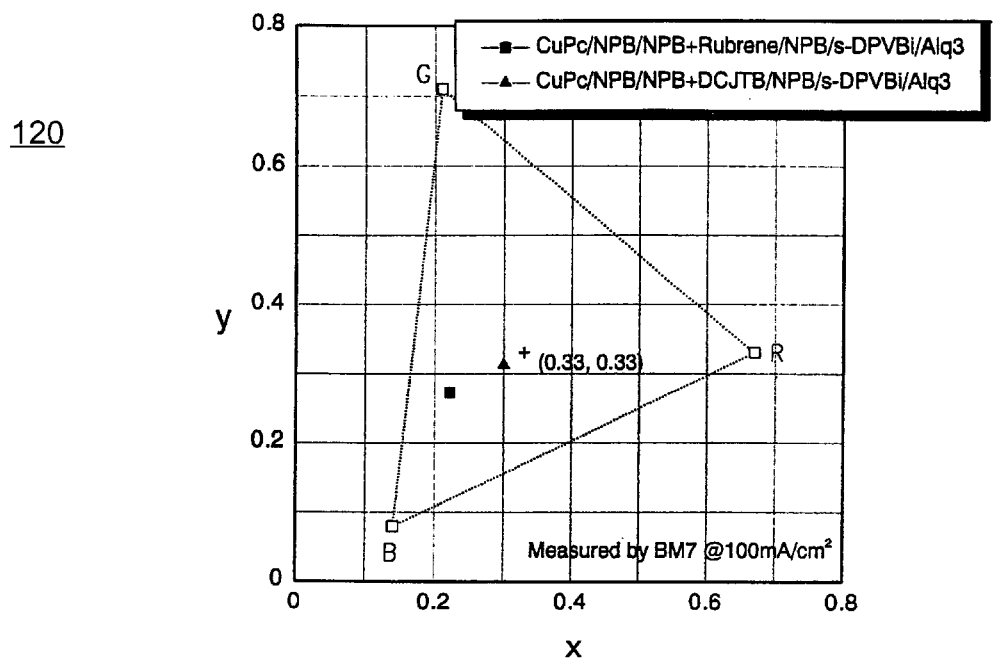
FIG. 12 illustrates CIE (Commission Internationale d'Eclairage) coordinates characteristics in organic electroluminescent devices manufactured by Examples 11 and 12.

The CIE coordinates characteristics of the organic electroluminescent devices manufactured in Examples 11 and 12 were measured and the results 120 thereof are shown in FIG. 12. Referring to FIG. 12, when CuPc was used for the hole injection layer (Example 11) and when NPB and Rubrene were used for the first light emitting layer (Example 12), white luminescence could be realized. In the case of using Rubrene as a dopant, instead of DCJTB, the CIE coordinates shifted toward blue luminescence, from which it is understood that desired color luminescence could be adjustably realized by varying the kind of dopant.

Figure 13:
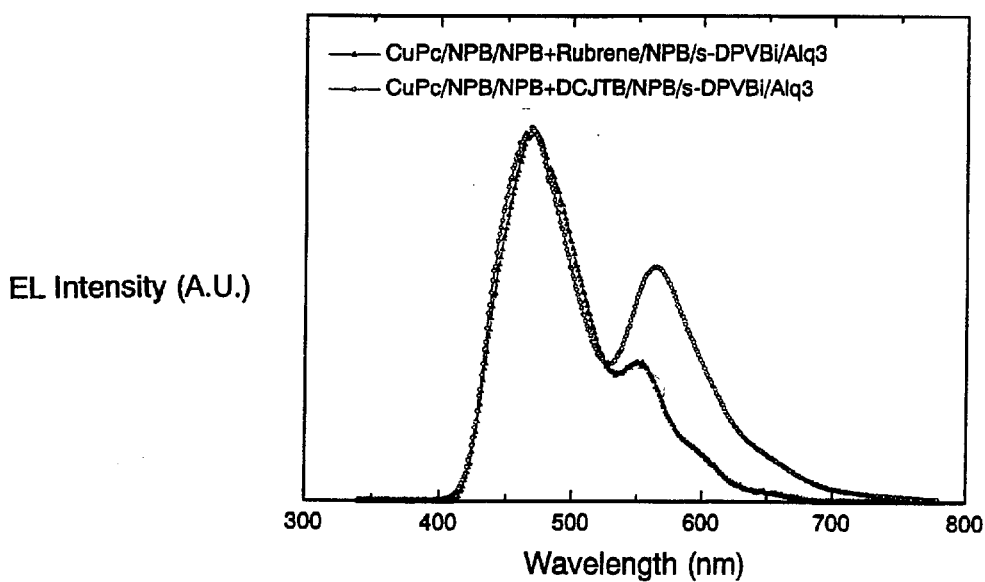
FIG. 13 illustrates emission spectrum in organic electroluminescent devices manufactured by Examples 11 and 12.

FIG. 13 illustrates emission spectrum 140, 150 in organic electroluminescent devices manufactured by Examples 11 and 12. Referring to FIG. 13, when DCJTB is doped (Example 11), the red-orange luminescence peak is stronger than when Rubrene is doped (Example 12).

Figure 14:
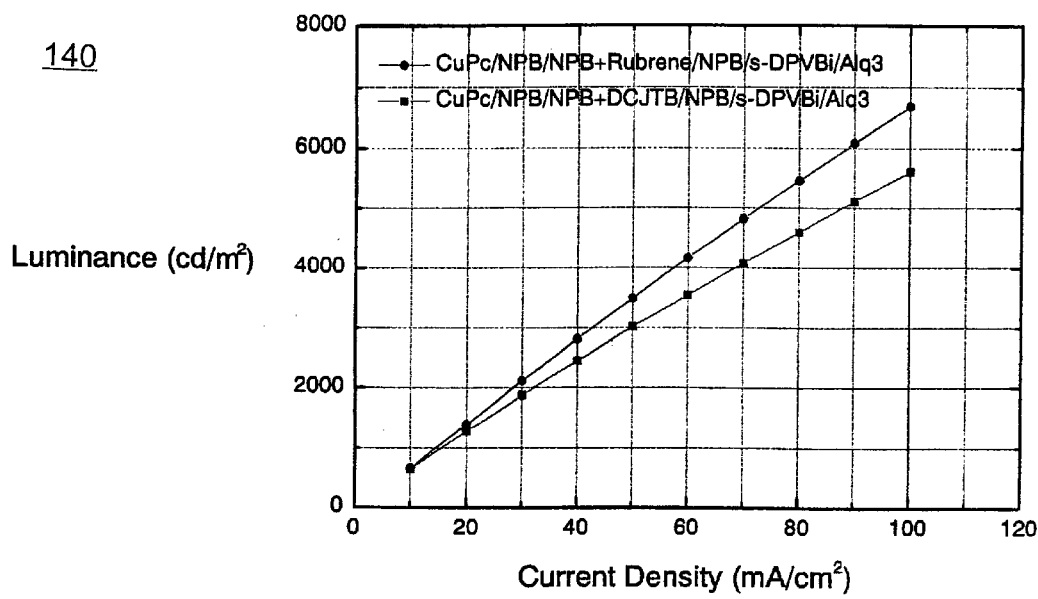
FIGS. 14 and 15 are graphs showing emission characteristics and changes in the luminous efficiency depending on current density in organic electroluminescent devices manufactured by Examples 11 and 12.
Figure 15:
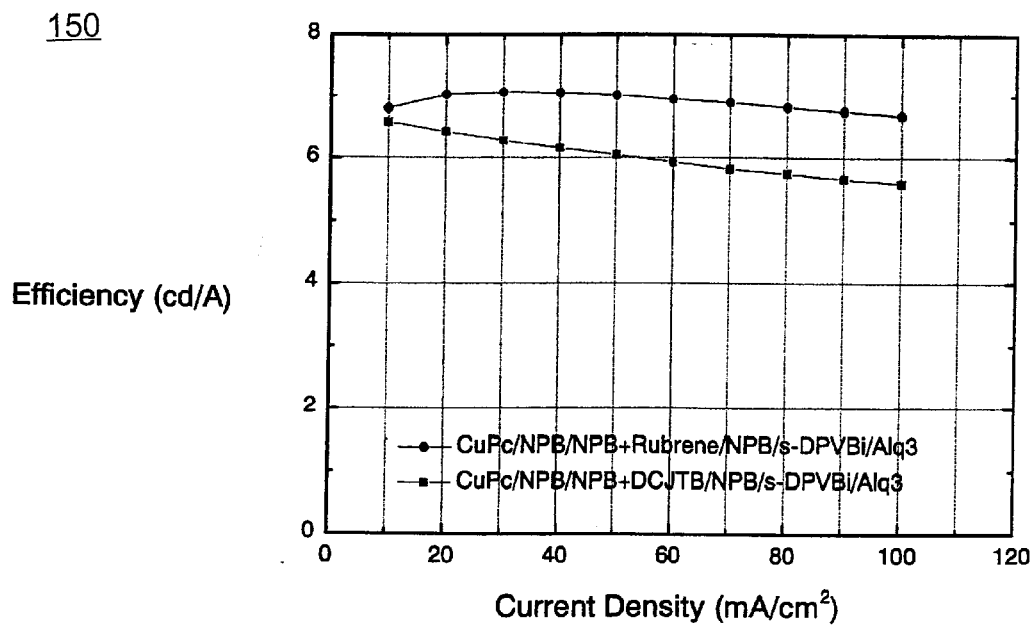

FIGS. 14 and 15 are graphs 140, 150 showing emission characteristics and changes in the luminous efficiency depending on current density in organic electroluminescent devices manufactured by Examples 11 and 12.

Referring to FIG. 14, the luminance linearly increases as the current density increases.

Referring to FIG. 15, when the CuPc hole injection layer is employed, the luminous efficiency of the device is maintained at 5.5 cd/A or higher.

In the organic electroluminescent devices manufactured in Examples 11 and 12, the luminance efficiency, external quantum efficiency and CIE coordinates characteristics were evaluated and the results thereof are summarized in Table 3.

TABLE 3

| | Dopant | Thickness of NPB (Å) | Luminous efficiency (cd/A) | External Quantum efficiency (%) | CIE coordinates (x, y) |
|---|---|---|---|---|---|
| Example 11 | DCJTB | 20 | 6.6 (@10 mA/cm$^2$) 5.6 (@100 mA/cm$^2$) | 3.26 | (0.30, 0.31) |
| Example 12 | Rubrene | 20 | 7.0 (@10 mA/cm$^2$) 6.7 (@100 mA/cm$^2$) | 3.01 | (0.22, 0.27) |

While specific embodiments of the present invention have been shown and described, further modifications and improvements will occur to those skilled in the art. It should be understood, therefore, that this invention is not limited to the particular forms shown and we intend in the appended claims to cover all modifications that do not depart from the spirit and scope of this invention.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An organic electroluminescent device comprising:
   a substrate, and an anode, a hole transport layer, a plurality of light emitting layers, an electron transport layer and a cathode laminated sequentially on the substrate, wherein a charge transport buffer layer adjusting the proportion of excitons generated by two of the plurality of light emitting layers by adjusting a film thickness, is formed between the light emitting layers.

2. The organic electroluminescent device according to claim 1, wherein the thickness of the charge transport buffer layer is in the range of 10 to 300 Å.

3. The organic electroluminescent device according to claim 1, wherein the charge transport buffer layer comprises host forming materials of the light emitting layers adjacent thereto.

4. The organic electroluminescent device according to claim 3, wherein the host forming materials of the light emitting layers include N,N'-Di(naphthalene-1-yl)-N,N'-diphenyl-benzidine (NPB).

5. The organic electroluminescent device according to claim 1, wherein the charge transport buffer layer comprises host forming materials of the hole transport layer or the electron transport layer.

6. The organic electroluminescent device according to claim 5, wherein the host forming materials of the hole transport layer include N,N'-Di(naphthalene-1-yl)-N,N'-diphenyl-benzidine (NPB).

7. The organic electroluminescent device according to claim 1, wherein the host forming materials of the charge transport layer, the light emitting layers and the hole transport layer include N,N'-Di(naphthalene-1-yl)-N,N'-diphenyl-benzidine (NPB).

8. The organic electroluminescent device according to claim 1, wherein one or more layers selected from the hole transport layer, the light emitting layers and the electron transport layer comprise 0.1 to 5 wt % of dopant capable of emitting light for hole-electron bonds.

9. The organic electroluminescent device according to claim 8, wherein the dopant is selected from the group consisting of 4-(dicyanomethylene)-2-t-butyl-6-(1,1,7,7-tetramethyljulolidyl-9-enyl)-4H-ryran (DCJTB), Coumarin 6, Rubrene, DCM, DCM2, perylene and Quinacridone.

10. The organic electroluminescent device according to claim 8, wherein the content of the dopant is 0.1 to 5 wt % based on the total weight of the hole transport layer, the light emitting layers and the electron transport layer.

11. The organic electroluminescent device according to claim 10, wherein the dopant is selected from the group consisting of 4-(dicyanomethylene)-2-t-butyl-6-(1,1,7,7-tetramethyljulolidyl-9-enyl)-4H-ryran (DCJTB), Coumarin 6, Rubrene, DCM, DCM2, perylene and Quinacridone.

12. The organic electroluminescent device according to claim 1, wherein a hole injection layer is further formed between the anode and the hole transport layer.

13. The organic electroluminescent device according to claim 1, wherein an electron injection layer is further formed between the cathode and the electron transport layer.

14. An apparatus comprising:

a substrate;

an anode formed on the substrate;

a hole transport layer formed on the anode;

a first light emitting layer formed on the hole transport layer and comprising an organic compound;

a charge transport buffer layer formed on the first light emitting layer;

a second light emitting layer formed on the charge transport layer and comprising an organic compound;

an electron transport layer formed on the second light emitting layer; and a cathode formed on the electron transport layer.

15. The apparatus as in claim 14, further comprising:

an electron injection layer formed between the cathode and the electron transport layer; and a hole injection layer formed between the anode and the hole transport layer.

* * * * *